United States Patent
Tomisawa

(10) Patent No.: US 9,590,670 B2
(45) Date of Patent: Mar. 7, 2017

(54) COMMUNICATION DEVICE

(71) Applicant: Renesas Electronics Corporation, Tokyo (JP)

(72) Inventor: Satoru Tomisawa, Tokyo (JP)

(73) Assignee: Renesas Electronics Corporation, Tokyo (JP)

( * ) Notice: Subject to any disclaimer, the term of this patent is extended or adjusted under 35 U.S.C. 154(b) by 0 days.

(21) Appl. No.: 15/014,402

(22) Filed: Feb. 3, 2016

(65) Prior Publication Data

US 2016/0248456 A1 Aug. 25, 2016

(30) Foreign Application Priority Data

Feb. 24, 2015 (JP) ................................ 2015-034037

(51) Int. Cl.
*H04B 1/04* (2006.01)
*H03H 7/01* (2006.01)
*H03F 1/56* (2006.01)

(52) U.S. Cl.
CPC ............ *H04B 1/0475* (2013.01); *H03F 1/56* (2013.01); *H03H 7/0115* (2013.01); *H04B 2001/0416* (2013.01)

(58) Field of Classification Search
CPC . H04B 1/0475; H04B 2001/0416; H03F 1/56; H03H 7/0115

USPC .......................................... 375/295, 296, 297
See application file for complete search history.

(56) References Cited

U.S. PATENT DOCUMENTS

| 2003/0078006 A1* | 4/2003 | Mahany ................... G06F 1/163 |
| | | 455/63.1 |
| 2010/0327816 A1* | 12/2010 | Chiang ................... H02J 7/045 |
| | | 320/145 |

FOREIGN PATENT DOCUMENTS

JP 2014-135641 A 7/2014

* cited by examiner

*Primary Examiner* — Siu Lee
(74) *Attorney, Agent, or Firm* — Sughrue Mion, PLLC

(57) ABSTRACT

There is to provide a communication device capable of reducing the power consumption. The communication device includes a battery and a transmission circuit for transmitting a signal of a desired transmission frequency upon receipt of a power supply from the battery. The transmission circuit includes a first oscillator for oscillating a signal, an amplifier for amplifying the signal oscillated by the first oscillator, and a filter circuit for eliminating a harmonic component included in the signal output from the amplifier. The filter circuit includes an extracting unit for extracting a frequency signal of n (n≥2) times frequencies of the transmission frequency from the signal output from the amplifier and a recovery unit for recovering the battery with DC component of the extracted n times frequency signal.

10 Claims, 5 Drawing Sheets

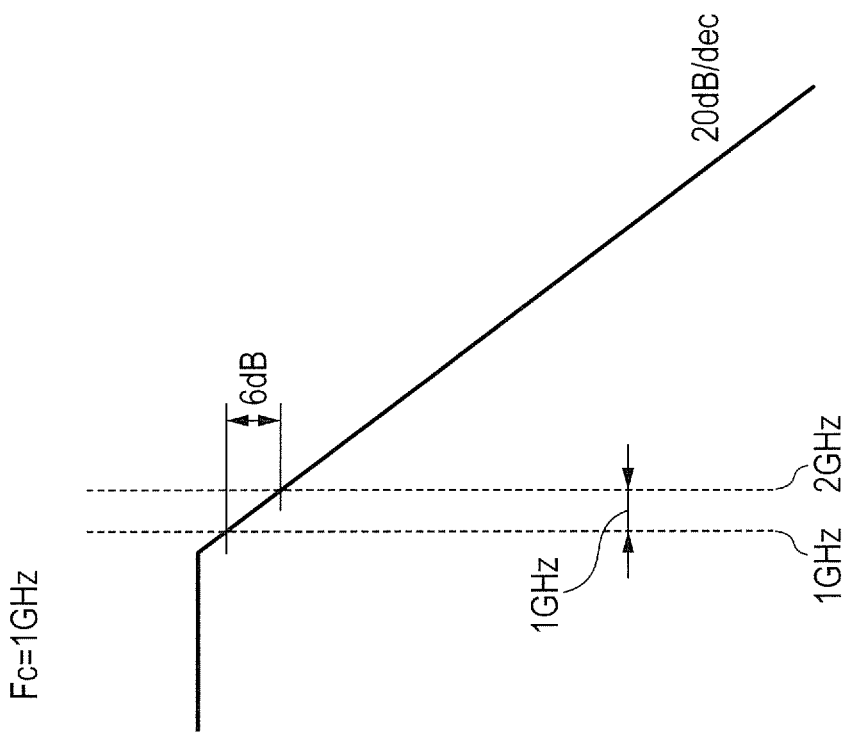
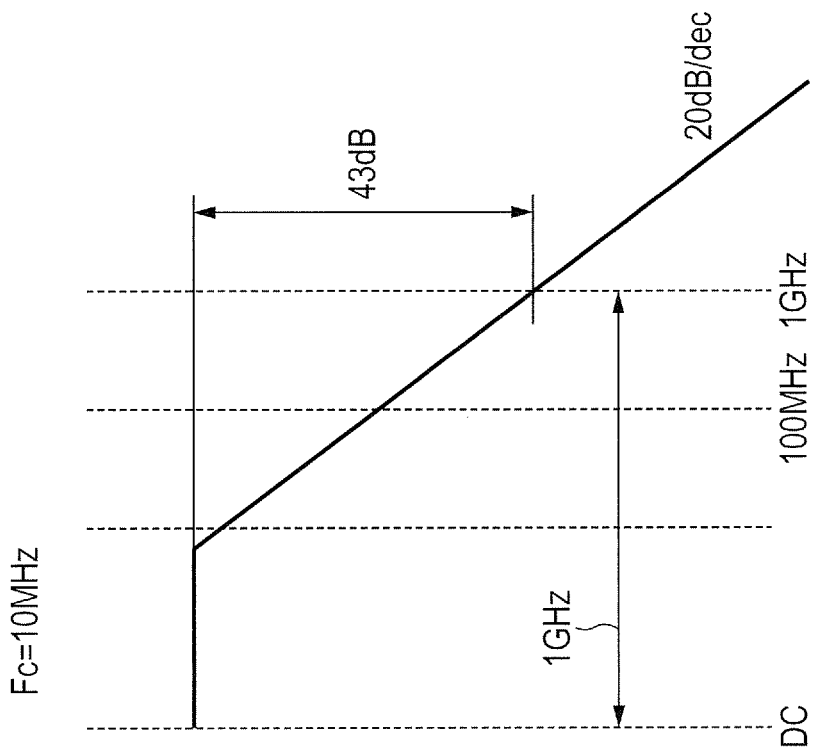

COMMUNICATION DEVICE

CROSS-REFERENCE TO RELATED APPLICATIONS

The disclosure of Japanese Patent Application No. 2015-034037 filed on Feb. 24, 2015 including the specification, drawings and abstract is incorporated herein by reference in its entirety.

BACKGROUND

This disclosure relates to a communication device and more particularly, to a communication device including a transmission circuit.

In the conventional communication device including a transmission circuit of a direct conversion method, a local oscillation signal created in an oscillator is divided by a divider, date signal is superimposed on the divided local oscillation signal, to create a high frequency signal, and the high frequency signal is amplified by an amplifier, hence to transmit the signal through an antenna.

In this communication device, a harmonic wave of high frequency signal occurs in the amplifier as a noise; therefore, various methods for eliminating the harmonic wave have been proposed (for example, Japanese Unexamined Patent Application Publication No. 2014-135641).

At the same time, in these days, there is a demand for reducing power consumption of a communication device; however, in order to drive such a circuit for eliminating the harmonic wave, extra power consumption is necessary.

In order to solve the above problem, this disclosure is to provide a communication device capable of reducing the power consumption.

Other objects and novel characteristics will be apparent from the description of the specification and the attached drawings.

SUMMARY

According to one embodiment, a communication device includes a battery and a transmission circuit for transmitting a signal of a desired transmission frequency upon receipt of a power supply from the battery. The transmission circuit includes a first oscillator for oscillating a signal, an amplifier for amplifying the signal oscillated by the first oscillator, and a filter circuit for eliminating a harmonic component included in the signal output from the amplifier. The filter circuit includes an extracting unit for extracting a frequency signal of n (n≥2) times frequencies of the transmission frequency from the signal output from the amplifier and a recovery unit for recovering the battery with DC component of the extracted n times frequency signal.

According to the embodiment, a communication device capable of reducing the power consumption can be realized by eliminating the harmonic component to recover the battery.

BRIEF DESCRIPTION OF THE DRAWINGS

FIGS. 4A and 4B are a view for use in describing the characteristic of the LPF 206.

DETAILED DESCRIPTION

Figure 1:
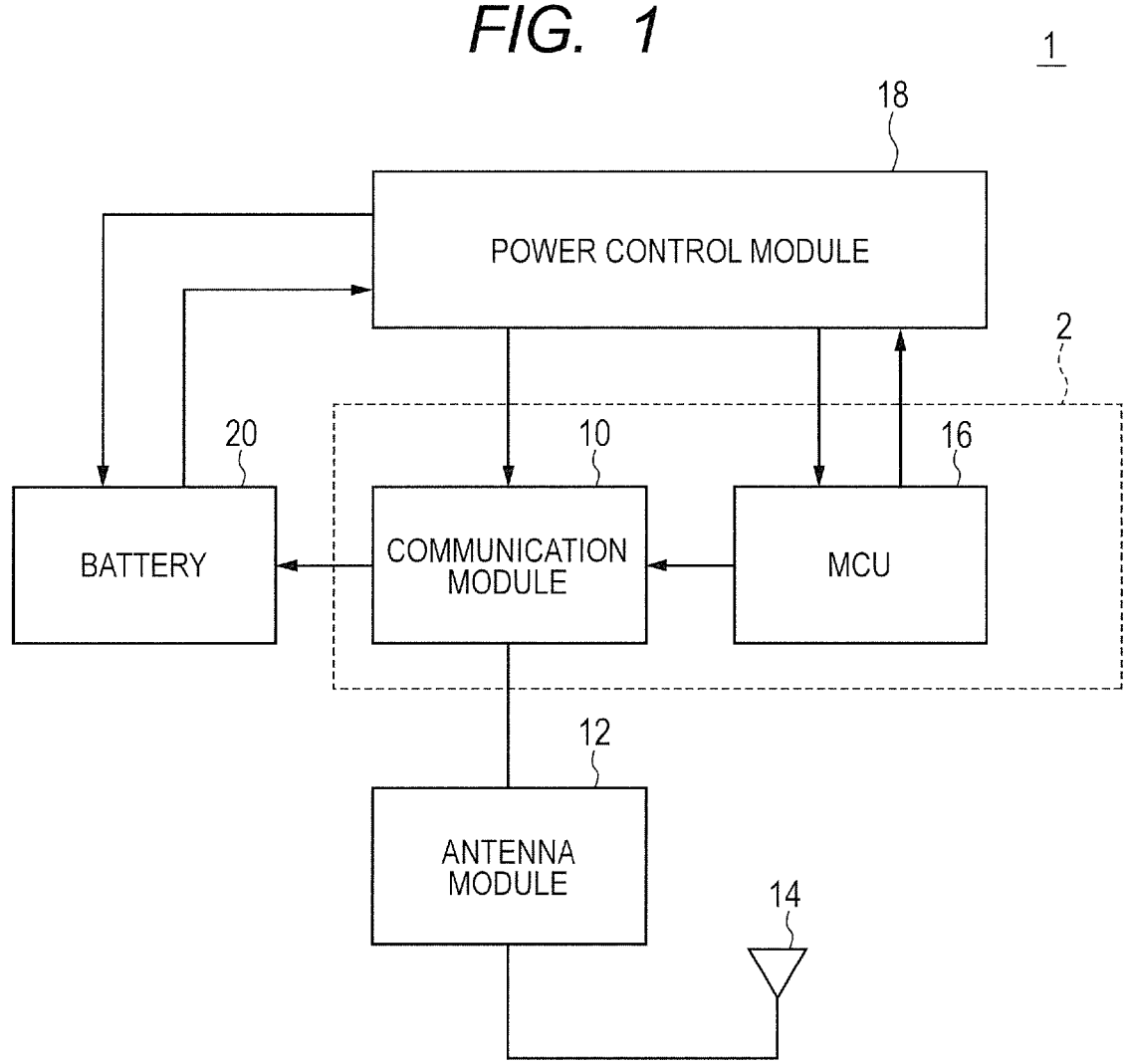
FIG. 1 is a view for use in describing the structure of a communication device 1 based on an embodiment.

An embodiment will be described in detail with reference to the drawings. In the drawings, the same codes are attached to the same or the corresponding portions and their description is not repeated.

FIG. 1 is a view for use in describing the structure of a communication device 1 based on the embodiment.

In FIG. 1, the communication device 1 for receiving and transmitting RF signals is illustrated.

As the RF signal, for example, a signal of 2.4 GHz band is used.

The communication device 1 includes a semiconductor device 2, an antenna module 12, an antenna 14, a power control module 18, and a battery 20.

The semiconductor device 2 includes, for example, a communication module 10 and a Main Control Unit (MCU) 16. The semiconductor device 2 may include all or a part of the antenna module 12 and the power control module 18. Alternatively, the semiconductor device 2 may be formed without the whole or a part of the MCU 16.

The power control module 18 is coupled to the battery 20 to supply necessary power to each unit.

The MCU 16 controls the whole communication device 1.

The antenna module 12 is coupled between the antenna 14 and the communication module 10, to perform impedance matching on a signal received by the antenna 14 and a signal transmitted to the antenna 14.

The communication module 10 runs according to the instruction of the MCU 16, to perform transmission and reception processing through the antenna module 12 coupled to the antenna 14. The communication module 10 outputs the received signal to the MCU 16. The communication module 10 outputs the transmission signal from the antenna 14 according to the instruction from the MCU 16.

Figure 2:
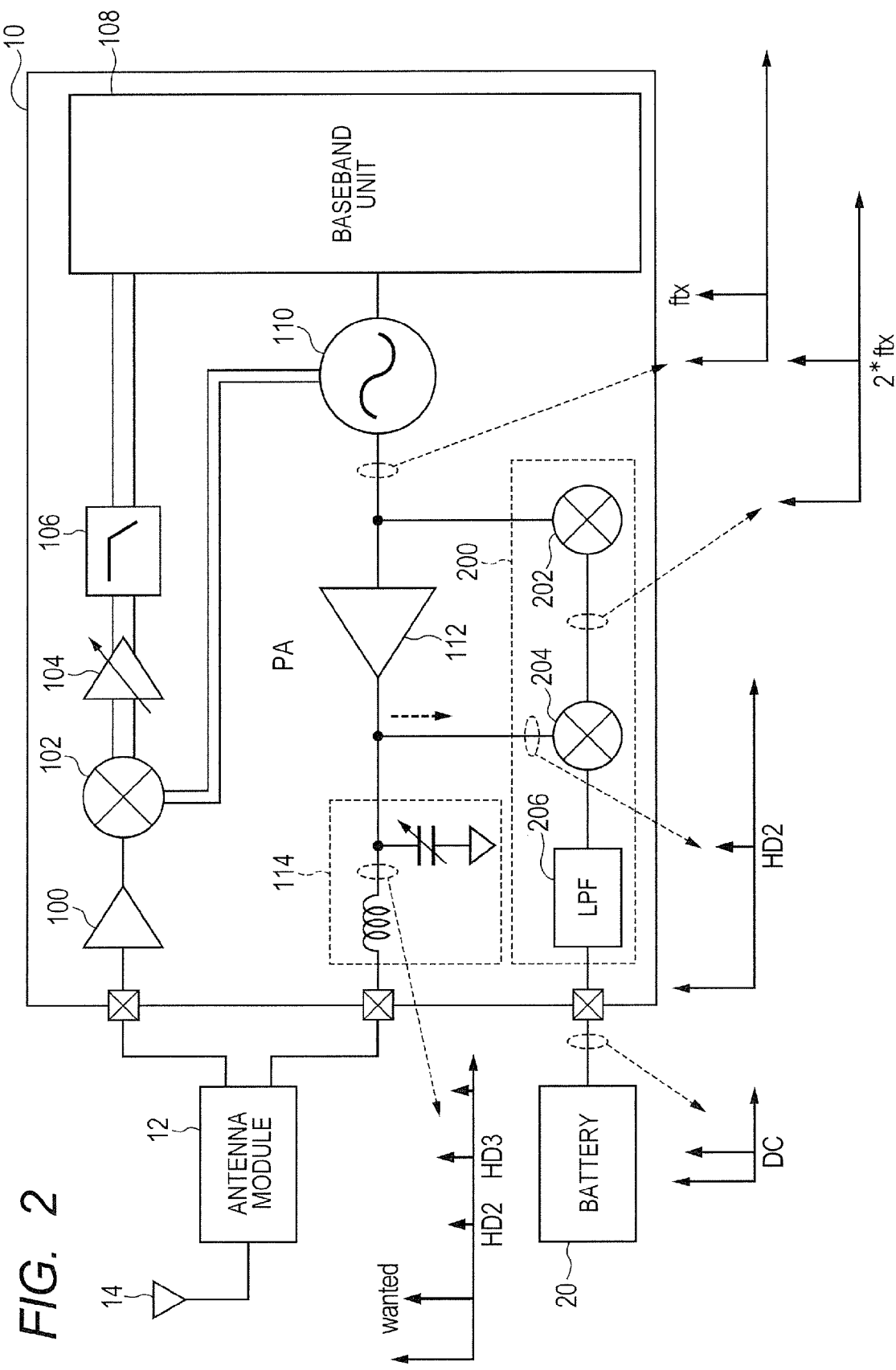
FIG. 2 is a view for use in describing the structure of a communication module 10 of the communication device 1 based on the embodiment.

FIG. 2 is a view for use in describing the structure of the communication module 10 of the communication device 1 based on the embodiment.

As illustrated in FIG. 2, the communication module 10 includes a Low Noise Amplifier (LNA) 100, a mixer 102, a Programmable Gain Amplifier (PGA) 104, a Low Pass Filter (LPF) 106, a baseband unit 108, an oscillator 110, a preamplifier 112, an LPF 114, and a filter 200.

The reception processing will be described.

Upon receipt of RF signal from the antenna 14 through the antenna module 12, the LNA 100 amplifies the input RF signal by low noise and outputs the same.

The mixer 102 multiplies the RF signal amplified by the LNA 100 by the local signal oscillated by the oscillator 110, down-converts the above result to a baseband reception signal (baseband signal at reception) of baseband frequency band, and outputs the above signal.

The mixer 102 is an orthogonal demodulator, to create the baseband signals Ich and Qch based on the RF signal and the local signal.

The local signal input to the mixer 102 is created by the oscillator 110.

The oscillator 110 is formed by a voltage control oscillator, which can change the oscillation frequency variable depending on a voltage.

Upon receipt of the input of the baseband signal, the PGA (variable gain amplifier) 104 further amplifies the input baseband received signal. The gain setting of the PGA 104 is properly performed by the baseband unit 108.

The LPF 106 performs the filtering processing for eliminating a high frequency component from the signal input from the PGA 104 and outputs the baseband received signal having been converted into a desired frequency to the baseband unit 108.

The baseband unit 108 demodulates the signal based on the baseband signals Ich and Qch and outputs the digital data to the MCU 16.

Next, the transmission processing will be described.

The oscillator 110 oscillates a signal of a desired transmission frequency according to the instruction of the baseband unit 108.

The level of the signal output from the oscillator 110 is amplified by the preamplifier 112 and output to the LPF 114.

The LPF 114 passes only the signal of the desired transmission frequency and outputs the signal of the desired transmission frequency from the antenna 14 through the antenna module 12.

Here, a harmonic wave will be described.

The signal of the desired transmission frequency output from the oscillator 110 generates a harmonic wave at a time of being amplified by the preamplifier 112.

The harmonic wave becomes a noise and the noise has to be eliminated.

In the embodiment, a method of eliminating a harmonic wave through the filter 200 will be described.

The filter 200 includes mixers 202 and 204 and the LPF 206.

The mixer 202 mixes the signal of the transmission frequency from the oscillator 110 and outputs the frequency signal of double frequencies of the transmission frequency to the mixer 204. The signal of the transmission frequency supplied from the oscillator 110 to the mixer 202 is branched within the mixer 202 and the signals of two transmission frequencies are mixed there.

The mixer 204 mixes the signal output from the preamplifier 112 and the double frequency signal output from the mixer 202.

The LPF 206 passes only a signal of the lower frequency component of the signals output from the mixer 204.

In FIG. 2, for example, a desired transmission frequency ftx is illustrated.

The mixer 202 outputs the double frequency signal 2×ftx of the desired transmission frequency. In the example, although the case of outputting the double frequency signal 2×ftx of the desired transmission frequency by the mixer 202 is described, it is not restricted to this but the double transmission frequency 2×ftx may be output from another oscillator different from the oscillator 110.

The case of extracting the double harmonic wave (HD2) of the desired transmission frequency through the filter 200 is illustrated.

According to this, in the signal input to the LPF 114, the component of the double harmonic wave (HD2) is suppressed and the LPF 114 outputs only the signal of the desired transmission frequency ftx to the antenna module 12.

Further, the double harmonic wave (HD2) input to the filter 200 is impedance-converted and input to the battery 20 as a DC component.

Figure 3:
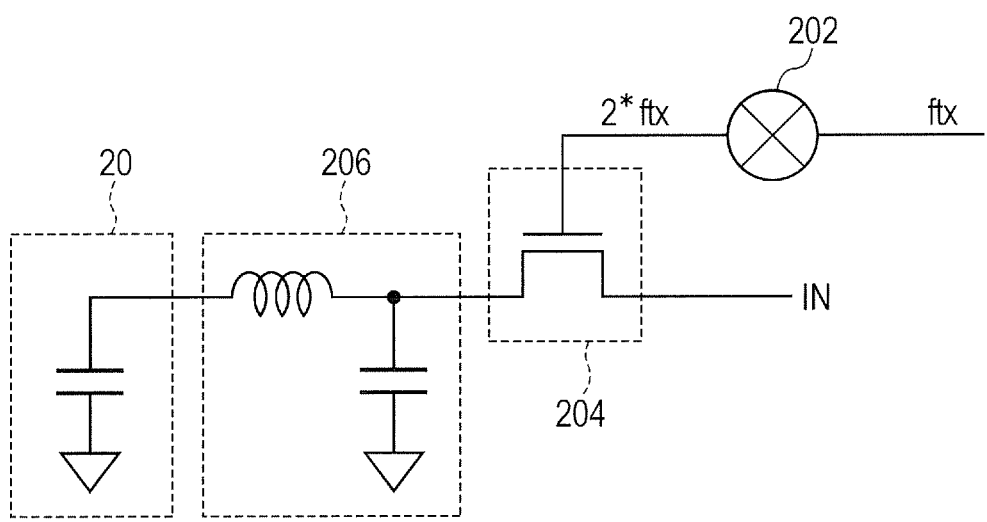
FIG. 3 is a view for use in describing the structure of a mixer 204 and an LPF 206 based on the embodiment.

FIG. 3 is a view for use in describing the structure of the mixer 204 and the LPF 206 based on the embodiment.

As illustrated in FIG. 3, the mixer 204 is formed by a switching mixer. More specifically, the switching mixer is formed by a transistor. The source side of the transistor is coupled to the output node of the preamplifier 112 and the gate thereof receives the output of the mixer 202.

According to the above structure, a signal component of the double frequency signal 2×ftx of the desired transmission frequency is extracted from the signals output from the preamplifier 112. Only the signal component of the frequency signal 2×ftx is passed through the gate of the transistor and impedance-converted.

The impedance-converted signal is filtered by the LPF 206. The double frequency signal of the transmission frequency is impedance-converted to the Direct Current (DC) component and therefore, in the LPF 206, only the high frequency component is cut.

The LPF 206 includes a resistor and a capacitor.

By applying a voltage of the DC component current to the battery 20 through the LPF 206, the battery 20 is recovered (charged). Because of the DC component current, there is no need to provide a rectification circuit but the LPF can be directly coupled to the battery 20. Therefore, the circuit can be simplified.

Further, the filter 200 based on the embodiment can not only eliminate the noise that is a harmonic wave output from the preamplifier 112 but also can collect a harmonic wave output as a noise from the preamplifier 112 to the battery 20, hence to reduce the power consumption.

In the conventional structure, various circuits for eliminating noise have been proposed; in order to drive the circuits, the circuit area has to be secured while consuming the electric power. The filter 200 can eliminate the noise as well as collect the noise as the power; therefore, the area can be effectively used. By forming the mixer 202 by the transistor as a switching mixer, the circuit area can be further reduced.

FIGS. 4A and 4B are a view for use in describing the characteristic of the LPF 206.

As illustrated in FIGS. 4A and 4B, the characteristic of eliminating the noise will be described.

As an example, the description will be made briefly in the case of the desired frequency signal of 1 GHz, a harmonic wave of 2 GHz, and a frequency difference of 1 GHz.

FIG. 4A shows that a harmonic wave can be attenuated by only 6 dB as for the desired frequency signal in filtering with the LPF 206 of the filter frequency of 1 GHz.

On the other hand, FIG. 4B shows the case where the frequency of the desired frequency signal is converted into the DC component.

Although the harmonic wave is 1 GHz, when the filter frequency of the LPF 206 is 10 MHz, the harmonic wave can be attenuated by 43 dB as for the desired frequency signal.

By using the LPF 206 at a low frequency band characteristically, the harmonic wave can be fully attenuated.

In the embodiment, although the method of collecting power with the harmonic wave of the double frequency signal of the desired transmission frequency eliminated has been described; however, it is not restricted to this but it can be similarly applied to a harmonic wave n (2 or more) times more of the frequency signal.

Even when the transmission frequency from the oscillator 110 is changed according to the frequency hopping method, the mixer 202 can output the double frequency signal of the transmission frequency to the mixer 204 and therefore, it can cope with the above method easily.

Modified Example

Figure 5:
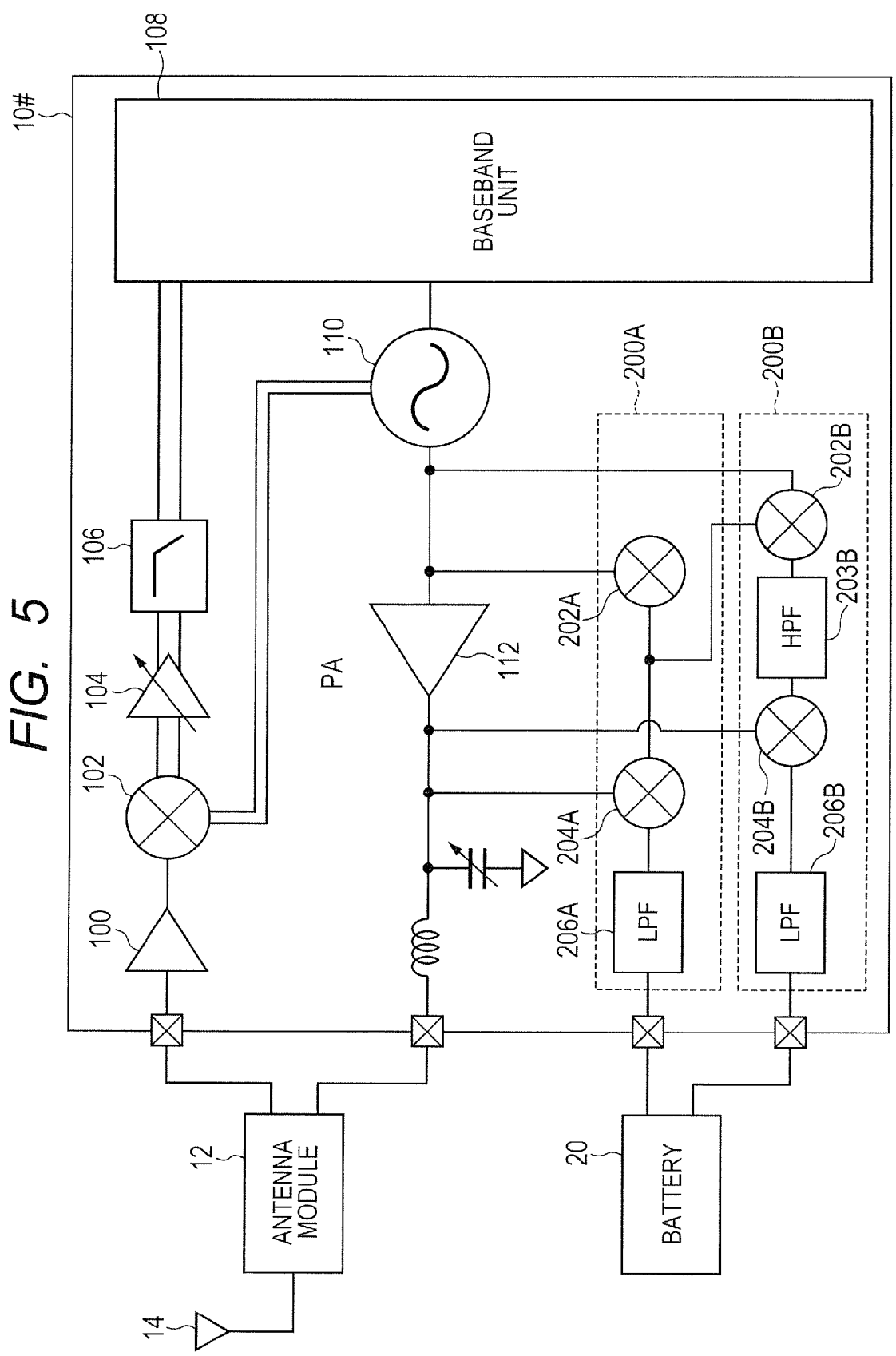
FIG. 5 is a view for use in describing the structure of a communication module 10# based on a modified example of the embodiment.

FIG. 5 is a view for use in describing the structure of a communication module 10# based on a modified example of the embodiment.

As illustrated in FIG. 5, the communication module 10# is different from the communication module 10 in that the filter 200 is replaced with a filter 200A and a 200B.

The filter 200A includes mixers 202A and 204A, and an LPF 206A.

The filter 200B includes mixers 202B and 204B, an HPF 203B, and an LPF 206B.

The mixer 202A mixes a signal of transmission frequency from the oscillator 110 and outputs the double frequency signal of the transmission frequency to the mixer 204A.

The mixer 202B mixes the double frequency signal output from the mixer 202A and the signal of the transmission frequency from the oscillator 110 and outputs the mixed signal to the HPF 203B. The HPF 203B passes the three-fold frequency signal of the transmission frequency of the signal mixed by the mixer 202B and outputs the above signal to the mixer 204B. The frequency signal of the corresponding transmission frequency obtained by mixing the double frequency signal output from the mixer 202A and the signal of the transmission frequency from the oscillator 110 is eliminated from the HPF 203B.

The mixer 204A mixes a signal output from the preamplifier 112 and the double frequency signal output from the mixer 202A.

The mixer 204B mixes a signal output from the preamplifier 112 and the three-fold frequency signal output from the HPF 203B.

The LPF 206A and 206B pass only the signal of lower frequency component of the signals output from the mixers 204A and 204B.

The mixers 204A and 204B are formed by switching mixers. Specifically, the switching mixer is formed by a transistor. The source side of the transistor is coupled to the output node of the preamplifier 112 and the gate thereof receives the respective outputs of the mixers 202A and 202B.

According to the above structure, in the mixer 204A, the signal component of the double frequency signal 2×ftx of the desired transmission frequency is extracted from the signal output from the signal preamplifier 112. Only the signal component of the frequency signal 2×ftx is passed through the gate of the transistor and impedance-converted.

Further, in the mixer 204B, the signal component of the three-fold frequency signal 3×ftx of the desired transmission frequency is extracted from the signal output from the preamplifier 112.

Only the signal component of the frequency signal 3×ftx is passed through the gate of the transistor and impedance-converted.

The impedance-converted signal is filtered in the LPF 206. Since the double frequency signal of the desired transmission frequency is impedance-converted to the Direct Current (DC) component, only the high frequency component is cut in the LPF 206A, and a voltage of the direct current component is applied to the battery 20 through the LPF 206A as mentioned above, hence to recover (charge) the battery 20.

Similarly, since the three-fold frequency signal of the desired transmission frequency is impedance-converted to the Direct Current (DC) component, only the high frequency component is cut in the LPF 206B, and a voltage of the direct current component is applied to the battery 20 through the LPF 206B as mentioned above, hence to recover (charge) the battery 20.

According to the structure, not only a noise that is a harmonic wave output from the preamplifier 112 is eliminated but also the harmonic wave output from the preamplifier 112 as a noise can be collected in the battery 20, hence to reduce the power consumption.

Further, the double and the three-fold frequency signals can be collected as a harmonic wave; therefore the power consumption can be further reduced. In the embodiment, although the method of eliminating the harmonic wave of the double and the third-fold frequency signal of the desired transmission frequency to recover the power has been described, it is not restricted to this but it is possible to recover the power with n (4, 5, . . . ) times frequency signal eliminated according to the same method.

As set forth hereinabove, although the disclosure has been concretely described based on the embodiment, the disclosure is not restricted to the embodiment and needless to say, various modifications and changes are possible in the scope without departing from the spirit.

What is claimed is:

1. A communication device comprising:
a battery; and
a transmission circuit for transmitting a signal of a desired transmission frequency upon receipt of a power supply from the battery,
wherein the transmission circuit includes:
a first oscillator for oscillating the signal;
an amplifier for amplifying the signal oscillated by the first oscillator; and
a filter circuit for eliminating a harmonic component included in the signal output from the amplifier,
wherein the filter circuit includes:
an extracting unit for extracting a frequency signal of n (n≥2) times frequencies of the transmission frequency from the signal output from the amplifier; and
a recovery unit for recovering the battery with a DC component of the extracted n times frequency signal.

2. The device according to claim 1,
wherein the filter circuit further includes a second oscillator for oscillating the n times frequency signal, and
the extracting unit is comprised of a mixer of mixing the n times frequency signal output from the second oscillator and the signal.

3. The device according to claim 2,
wherein the second oscillator oscillates the n times frequency signal based on the signal output from the first oscillator.

4. The device according to claim 2,
wherein a source of the mixer is coupled to a node of transmitting the signal and a gate thereof includes a transistor which receives an input of the n times frequency signal output from the second oscillator.

5. The device according to claim 1,
wherein the transmission circuit further includes:
an antenna; and
a low pass filter provided between the antenna and the amplifier.

6. The device according to claim 1,
wherein the extracting unit extracts the frequency signal of double frequencies of the transmission frequency from the signal output from the amplifier.

7. The device according to claim 1,
wherein the recovery unit is a low pass filter.

8. The device according to claim 7,
wherein the recovery unit includes a capacitor and a resistor.

9. A communication device comprising:
a battery; and
a transmission circuit for transmitting a signal of a desired transmission frequency upon receipt of a power supply from the battery,
wherein the transmission circuit includes:
a first oscillator for oscillating the signal;
an amplifier for amplifying the signal oscillated by the first oscillator; and
a filter circuit for eliminating a harmonic component included in the signal output from the amplifier,
wherein the filter circuit includes:
a plurality of extracting units for extracting a frequency signal of n (n≥2) times frequencies of the transmission frequency from the signal output from the amplifier; and
a recovery unit for recovering the battery with DC components of the respectively extracted n times frequency signals.

10. The device according to claim 9,
wherein respective values of the n in the extracting units are various.

* * * * *